United States Patent
Liou et al.

(10) Patent No.: US 10,373,827 B2
(45) Date of Patent: Aug. 6, 2019

(54) METHOD OF PATTERN TRANSFER

(71) Applicant: UNITED MICROELECTRONICS CORP., Hsinchu (TW)

(72) Inventors: En-Chiuan Liou, Tainan (TW); Yu-Cheng Tung, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 18 days.

(21) Appl. No.: 15/489,842

(22) Filed: Apr. 18, 2017

(65) Prior Publication Data

US 2018/0301336 A1    Oct. 18, 2018

(51) Int. Cl.
| | |
|---|---|
| H01L 21/033 | (2006.01) |
| H01L 21/762 | (2006.01) |
| H01L 29/66 | (2006.01) |
| H01L 21/308 | (2006.01) |

(52) U.S. Cl.
CPC ...... *H01L 21/0337* (2013.01); *H01L 21/3086* (2013.01); *H01L 21/76224* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,148,269 B2 | 4/2012 | Balseanu et al. | |
| 8,722,541 B2 | 5/2014 | Lin | |
| 9,099,470 B2 | 8/2015 | Lee et al. | |
| 9,362,119 B2 | 6/2016 | Ou et al. | |
| 2014/0162461 A1* | 6/2014 | Kim | H01L 21/0337 438/703 |
| 2016/0155639 A1 | 6/2016 | Chang et al. | |

\* cited by examiner

*Primary Examiner* — Bo B Jang
(74) *Attorney, Agent, or Firm* — WPAT, PC

(57) ABSTRACT

A method of pattern transfer is provided, comprising: providing a target layer; forming a first pattern above the target layer; forming a second pattern (such as spacer loops) above the target layer and above the first pattern, wherein one closed end of the second pattern partially overlaps with the first pattern; and transferring the second pattern to the target layer, wherein the first pattern stops transferring pattern of the closed end of the second pattern to the target layer.

19 Claims, 16 Drawing Sheets

METHOD OF PATTERN TRANSFER

BACKGROUND

Technical Field

The disclosure relates in general to a method of pattern transfer, and more particularly to a method of pattern transfer with a pre-cut pattern.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers. In a typical process for forming patterns of semiconductor device, a sidewall image transfer (SIT) is generally adopted, and the patterns of the mandrel are provided to define the related elements. For a conventional manufacturing process, after a pattern is transferred to a target layer, a line pattern having closed ends is typically formed, and it requires an extra step later for cutting connecting ends of the lines.

SUMMARY

The disclosure is directed to a method of pattern transfer. The proposed method of the present embodiments is related to a first pattern formed before a second pattern positioned above, so as to cut around mandrel pattern edge firstly or cut the closed ends of second pattern such as spacer loops during pattern transferring.

According to one aspect of the present disclosure, a method of pattern transfer is provided, comprising: providing a target layer; forming a first pattern above the target layer; forming a second pattern (such as spacer loops) above the target layer and above the first pattern, wherein one closed end of the second pattern partially overlaps with the first pattern; and transferring the second pattern to the target layer, wherein the first pattern stops transferring pattern of the closed end of the second pattern to the target layer.

According to another aspect of the present disclosure, a method of pattern transfer is provided, comprising: providing a target layer having a first region and a second region; forming a first pattern above the target layer; forming a second pattern above the target layer and above the first pattern, and the second pattern comprising a first spacer loops in the first region and a second spacer loops in the second region, wherein adjacent closed ends of the first spacer loops and the second spacer loops are formed above and corresponding within a first feature of the first pattern; and transferring the second pattern to the target layer, wherein the first feature of the first pattern stops transferring pattern of the adjacent closed ends of the first spacer loops and the second spacer loops to the target layer.

Figure 1A:
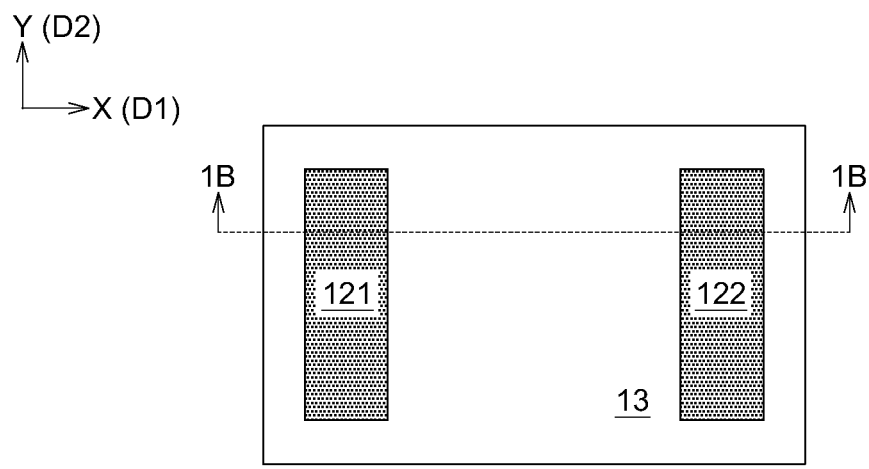
FIG. 1A to FIG. 7 illustrate one applicable method of pattern transfer by forming a pre-cut pattern according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a method of pattern transfer is provided. In the embodied method, a pre-cut pattern (such as a first pattern formed above a target layer) is formed for determining cutting positions before forming another pattern such as mandrels and sidewall spacers (i.e. referred as a second pattern in the embodiment), and the pre-cut pattern of the embodiment stops transferring pattern of the closed end of another pattern (ex: second pattern) to the target layer. Therefore, after transferring the second pattern (such as sidewall spacers remained configured as spacer loops) to the target layer, a patterned target layer has a line pattern without closed ends.

The embodiments can be applied to different types of semiconductor devices having patterns without closed ends in the desired regions. Embodiments are provided hereinafter with reference to the accompanying drawings for describing the related procedures and configurations. The identical and/or similar elements of the embodiments are designated with the same and/or similar reference numerals. However, the structural details of the embodiments are provided merely for illustration, not for limitation. Thus, it is noted that not all embodiments of the invention are shown. There may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1A to FIG. 7 illustrate one applicable method of pattern transfer by forming a pre-cut pattern according to one embodiment of the disclosure. In the exemplified process flow, figures labeled with "B" and/or figures labeled with "C" are cross-sectional drawings of figures labeled with "A".

Figure 1B:
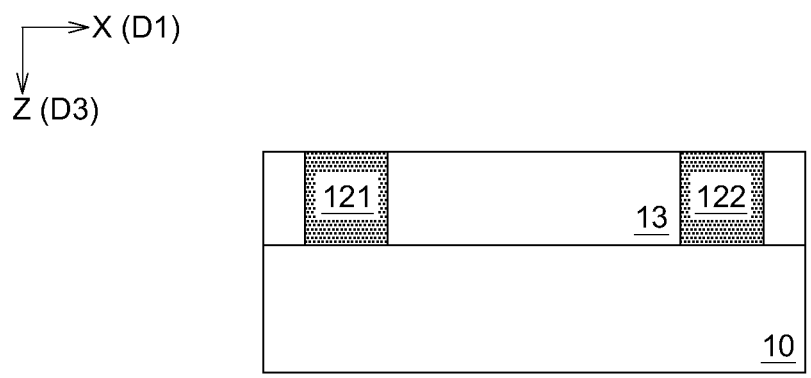

FIG. 1A is a top view of a pre-cut pattern according to one embodiment, and FIG. 1B is a cross-sectional view of FIG. 1A along a cross-sectional line 1B-1B (in X-direction). As shown in FIG. 1A and FIG. 1B, a target layer 10 is provided, and forming a first pattern 121 and 122 above the target layer 10. Noted that the process flow as shown in FIG. 1A-FIG. 7 exemplifies an underlying material layer 13 formed on the target layer 10 (ex: substrate) for illustrating one of applicable processes. However, the disclosure is not limited thereto. In practical applications, the target layer 10 may comprise one or more materials used for forming semiconductor devices including a silicon substrate material, an oxide material, a conductive material such as a polysilicon material, or the like.

Next, a second pattern is formed on the material layer 13, and one of applications is exemplified in FIG. 2A-FIG. 4C.

Figure 2A:
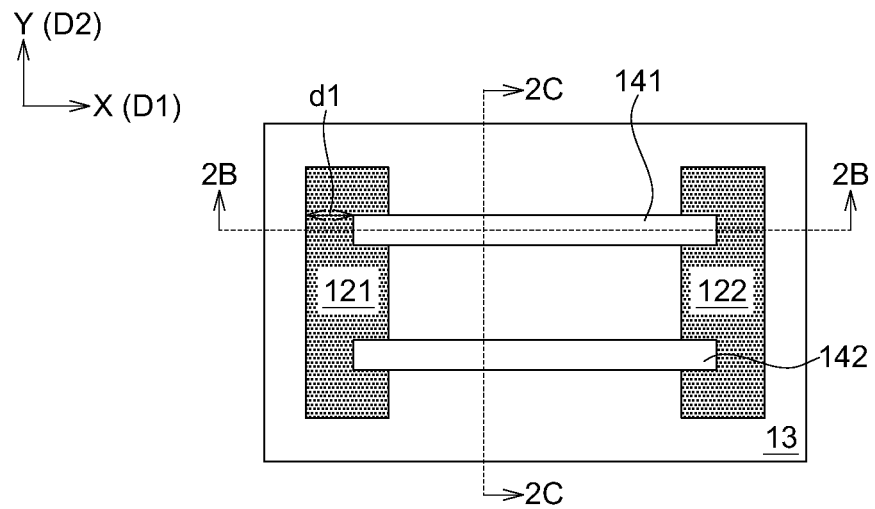
Figure 2B:
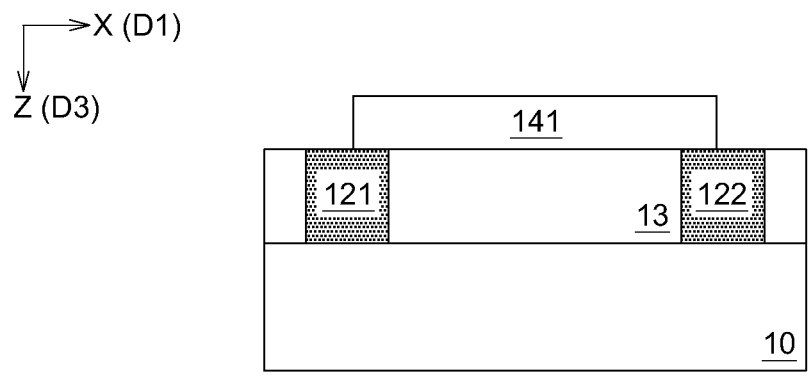
Figure 2C:
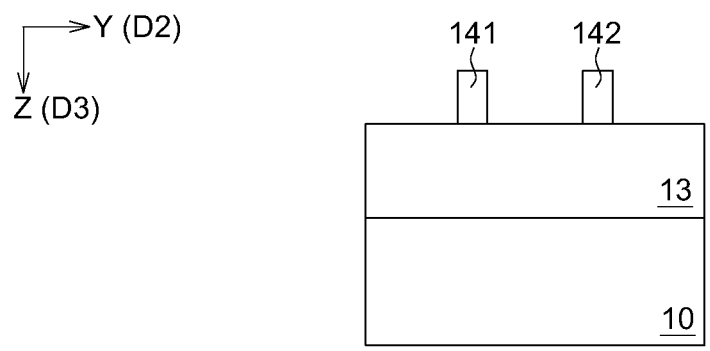

FIG. 2A is a top view of mandrels according to one embodiment, FIG. 2B is a cross-sectional view of FIG. 2A along a cross-sectional line 2B-2B (in X-direction), and FIG. 2C is a cross-sectional view of FIG. 2A along a cross-sectional line 2C-2C (in Y-direction). As shown in FIG. 2A, FIG. 2B and FIG. 2C, the mandrels 141 and 142 are formed on the material layer 13, and ends of the mandrels 141 and 142 overlap above the first pattern. In one embodiment, the first pattern 121 has a first edge 121a and a second edge 121b positioned oppositely, and the ends of the mandrels 141 and 142 extend over the second edge 121b but spaces apart from the first edge 121a such as by a first distance d1, as shown in FIG. 2A. Therefore, the ends of the mandrels 141 and 142 are disposed correspondingly between the first edge 121a and the second edge 121b, wherein the first edge 121a of the first pattern 121 is farther from the pattern of the mandrels (ex: 141 and 142) than the second edge 121b. The first pattern 122 would have the structural configuration similar to the first pattern 121, which are not repeatedly described.

Figure 3A:
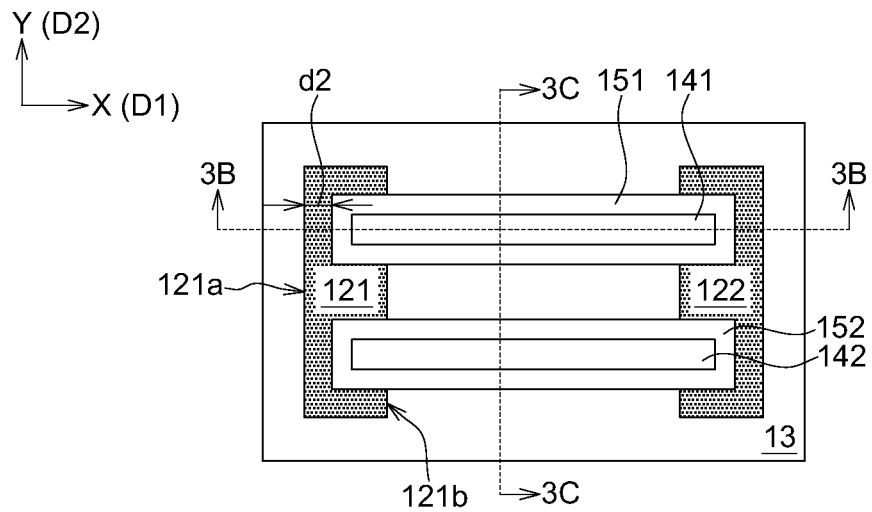
Figure 3B:
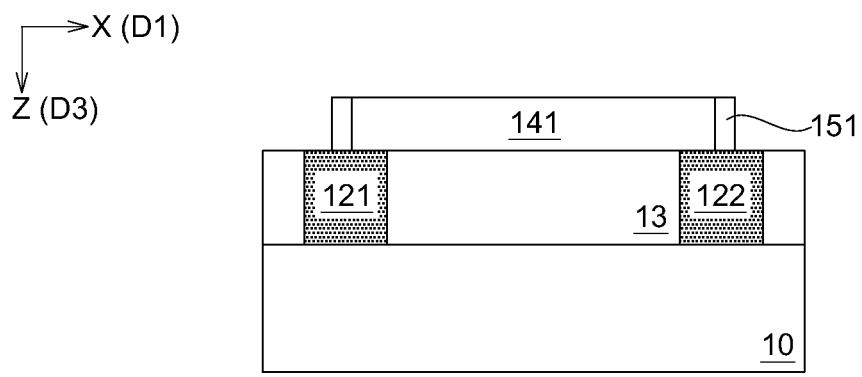
Figure 3C:
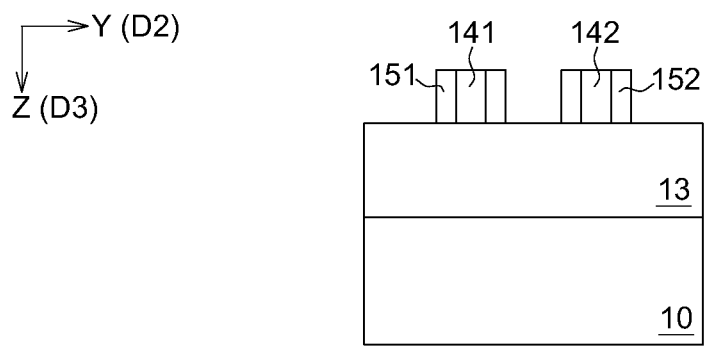
Figure 4A:
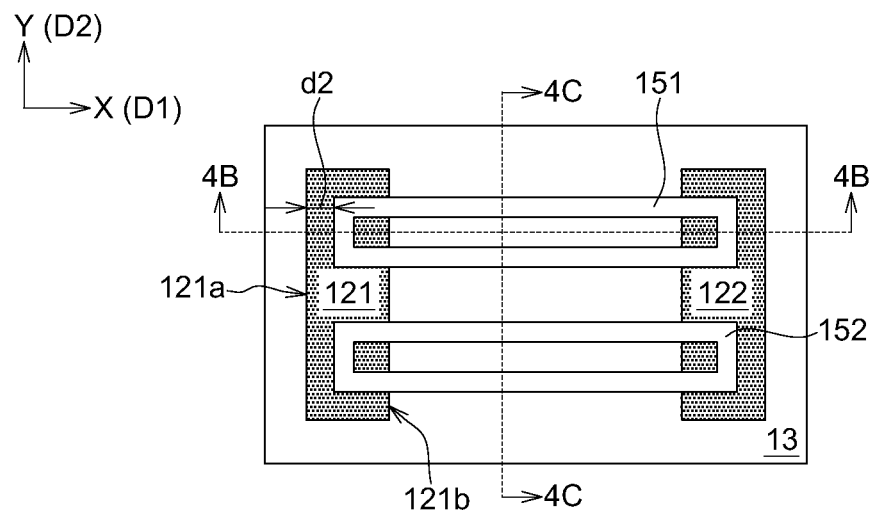
Figure 4B:
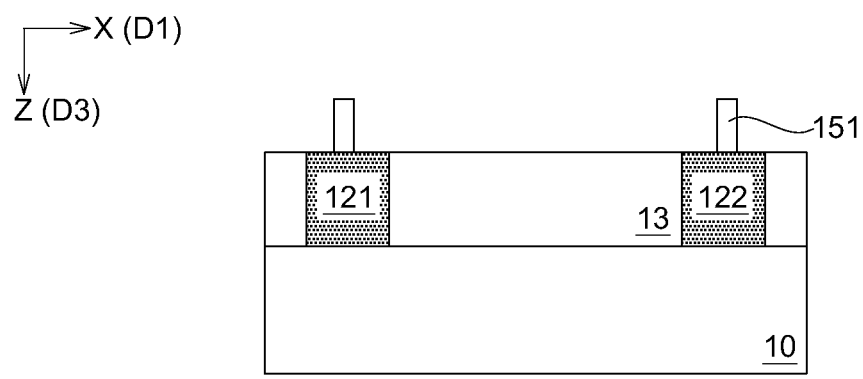
Figure 4C:
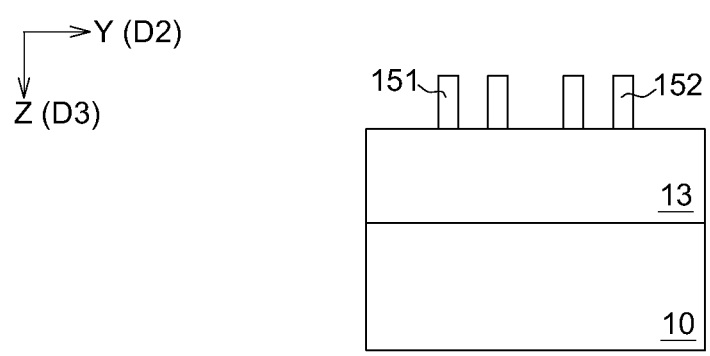

FIG. 3A is a top view of sidewall spacers surrounding the mandrels according to one embodiment, FIG. 3B is a cross-sectional view of FIG. 3A along a cross-sectional line 3B-3B (in X-direction), and FIG. 3C is a cross-sectional view of FIG. 3A along a cross-sectional line 3C-3C (in Y-direction). As shown in FIG. 3A, FIG. 3B and FIG. 3C, the sidewall spacers 151 and 152 are formed for surrounding sidewalls of the mandrels 141 and 142, respectively. FIG. 4A is a top view of sidewall spacers remained according to one embodiment, FIG. 4B is a cross-sectional view of FIG. 4A along a cross-sectional line 4B-4B (in X-direction), and FIG. 4C is a cross-sectional view of FIG. 4A along a cross-sectional line 4C-4C (in Y-direction). Afterwards, the mandrels 141 and 142 are removed, as shown in FIG. 4A, FIG. 4B and FIG. 4C; in one embodiment, the sidewall spacers 151 and 152 remained form a second pattern (ex: above a first pattern such as 121 and 122). In one embodiment, the closed ends of the sidewall spacers 151 and 152 remained (ex: configured as spacer loops from the top view of FIG. 4A) extend over the second edge 121b of the first pattern 121 but spaces apart from the first edge 121a of the first pattern 121 by a second distance d2, wherein the second distance d2 (FIG. 3A) is smaller than the first distance d1 (FIG. 2A). Accordingly, in an embodied method, a second pattern such as spacer loops (ex: 151 and 152 remained in FIG. 4A) is formed above the target layer 10 and also above the first pattern 121 and 122, wherein one closed end of the second pattern partially overlaps with the first pattern and doesn't extend over the first pattern. In other words, for example, one closed end of the second pattern partially overlaps with the first pattern without crossing over the first pattern from a top view of the first pattern and the second pattern, as shown in FIG. 4A.

Figure 5A:
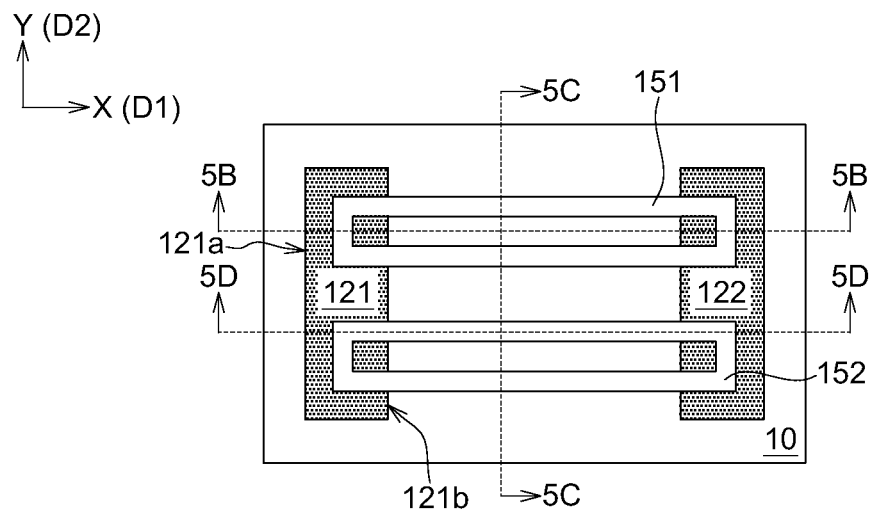
Figure 5B:
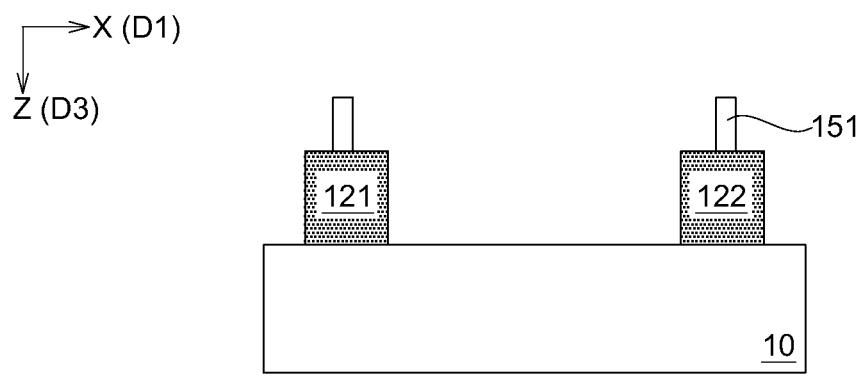
Figure 5C:
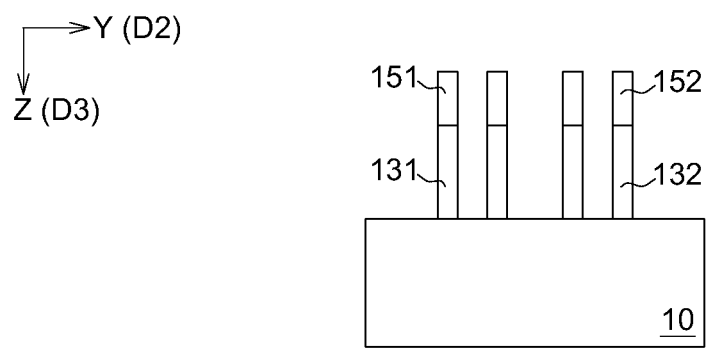
Figure 5D:
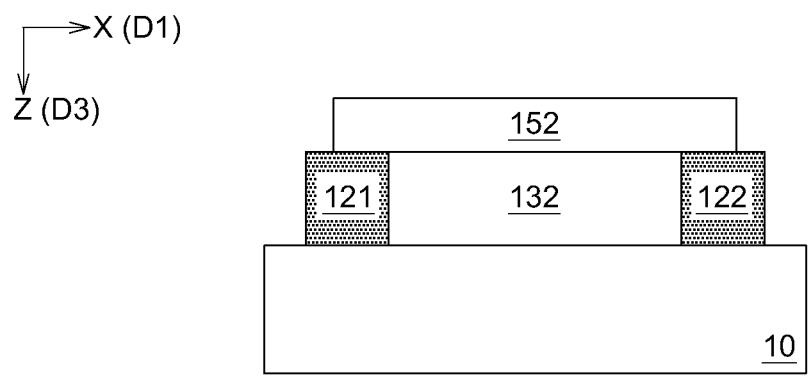

FIG. 5A is a top view of sidewall spacers and the first pattern after pattern transfer according to one embodiment, FIG. 5B is a cross-sectional view of FIG. 5A along a cross-sectional line 5B-5B (in X-direction), FIG. 5C is a cross-sectional view of FIG. 5A along a cross-sectional line 5C-5C (in Y-direction), and FIG. 5D is a cross-sectional view of FIG. 5A along a cross-sectional line 5D-5D (in X-direction). As shown in FIG. 5A-FIG. 5D, the second pattern (ex: spacer loops) is transferred to the underlying material layer 13 to form a patterned material layer such as 131 and 132. Accordingly, in one embodiment, the patterned material layer comprises a line pattern (ex: 131 and 132) after pattern transfer, wherein the closed end of the second pattern (ex: spacer loops) is blocked (/shielded) by the first pattern during pattern transfer.

Figure 6A:
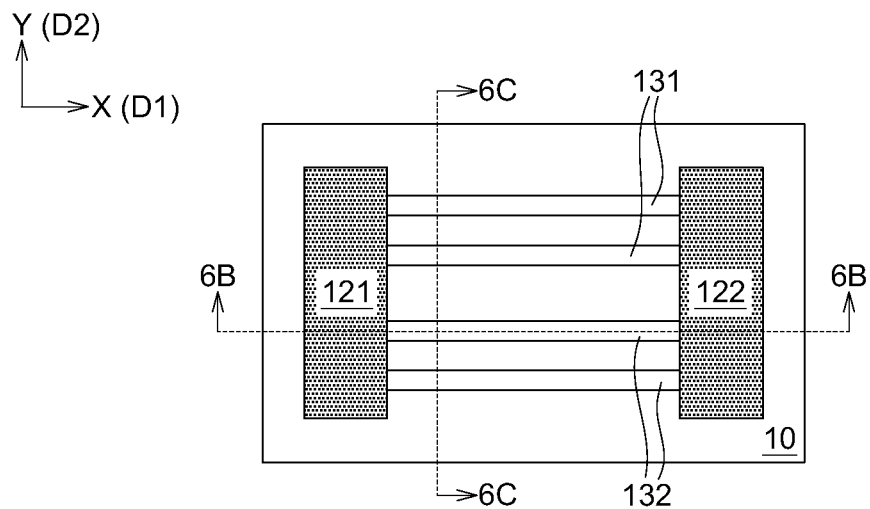
Figure 6B:
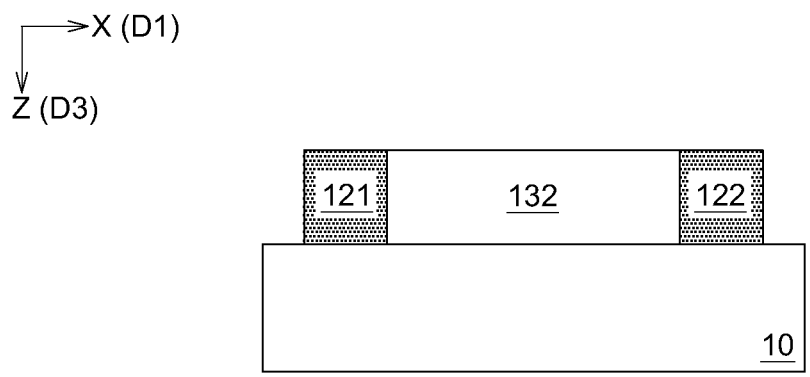
Figure 6C:
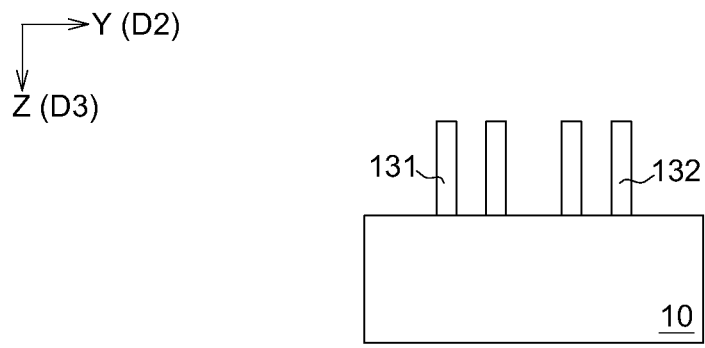
Figure 6C:
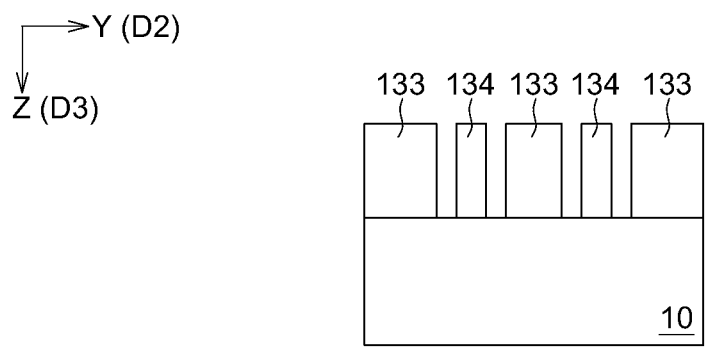

FIG. 6A is a top view of the patterns after removing sidewall spacers according to one embodiment, FIG. 6B is a cross-sectional view of FIG. 6A along a cross-sectional line 6B-6B (in X-direction), and FIG. 6C is a cross-sectional view of FIG. 6A along a cross-sectional line 6C-6C (in Y-direction). As shown in FIG. 6A-FIG. 6C, the sidewall spacers 151 and 152 (i.e. spacer loops) are removed. From the top view of FIG. 6A, it is clearly indicated that no closed ends are formed at the underlying pattern; in one embodiment, the patterned material layer 131 and 132 configured as lines parallel to each other. It is noted that the figures in FIG. 6A-FIG. 6C merely illustrate one of applications, and other types of the underlying pattern on the target layer 10 could be applied. For example, FIG. 6C' illustrates another pattern such as a patterned material layer comprising the wider lines 133 and the narrower lines 134 (between the wider lines 133) on the target layer 10. In practical applications, the patterned material layer (ex: 131, 132 or 133, 134) depends on the desired pattern to-be-transferred to the target layer 10, and the present disclosure has no particular limitation thereto.

Figure 7:
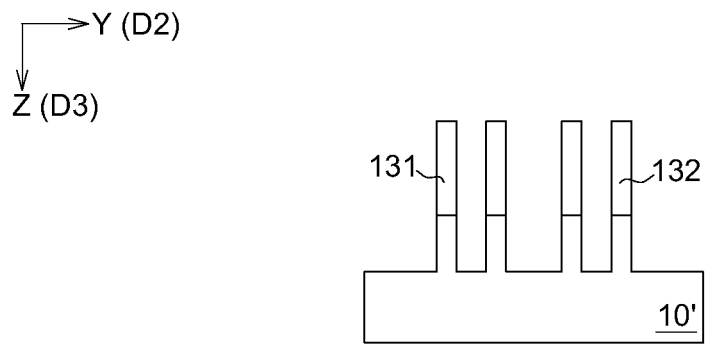

FIG. 7 is a cross-sectional view of transferring the second pattern to the target layer 10 according to one embodiment; for example, by etching the target layer 10 using the patterned material layer 131 and 132. Please see FIG. 6C and FIG. 7, both showing the same cross-sectional views along the cross-sectional line in Y-direction. From the top view in FIG. 6A, it is known that no closed ends are formed at the underlying pattern. Accordingly, the first pattern (such as 121 and 122) stops transferring pattern of the closed ends of the second pattern to the target layer 10, so as to form a patterned target layer 10' as shown in FIG. 7.

It is noted that the materials and layers of the target layer 10, the first pattern (such as 121 and 122) and the second pattern above the first pattern as mentioned above are not particularly limited, and can be any materials and layers for satisfying the needs of implementations. In practical applications, the patterns such as the first pattern (121 and 122) and the second pattern (ex: the sidewall spacers 151 and 152 remained configured as spacer loops) also may comprise one or more materials used for forming semiconductor devices including a silicon substrate material, an oxide material, a conductive material such as a polysilicon material, or the like.

According to one embodiment, the first pattern can be formed above a substrate, and the mandrels with the sidewall spacers (i.e. the spacer loops are regarded as the second pattern) can be formed above the first pattern.

Figure 8A:
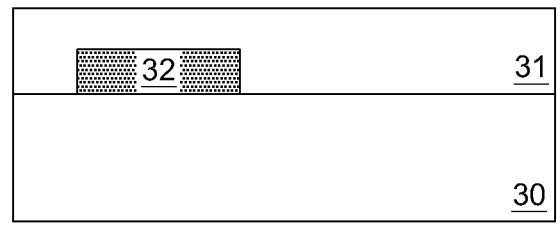
FIG. 8A and FIG. 8B, which show another configuration of pattern transfer according to another embodiment of the disclosure.
Figure 8B:
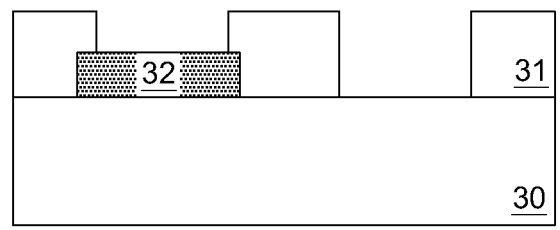

In one embodiment, the first pattern (such as but not limited to a hardmask) is formed on the substrate (ex: the target layer 10) and aligned with a top surface of the underlying material layer as shown in FIG. 1B, and the mandrels 141 and 142 with the sidewall spacers 151 and 152 are formed on the underlying material layer 13 and above the first pattern (ex: 121 and 122) as shown in FIG. 2A-FIG. 2C. However, the disclosure is not limited thereto. In other embodiment, a first pattern 32 is formed on a target layer such as a substrate 30 and buried in the underlying material layer 31, and the mandrels with the sidewall spacers are formed on the underlying material layer and above the first pattern. Please see FIG. 8A and FIG. 8B, which show another configuration of pattern transfer according to another embodiment of the disclosure. The first pattern 32 buried in the underlying material layer 31 is also corresponding to the position(s) of the closed end(s) of the to-be-transferred pattern (ex: second pattern), which is able to stop pattern transfer of the closed end of the second pattern during pattern transfer etching step.

Figure 9:
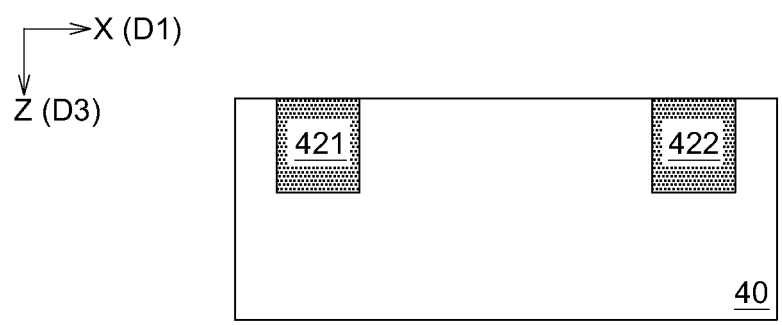
FIG. 9 shows a further configuration of pattern transfer according to one embodiment of the disclosure.

Additionally, in a further embodiment, a first pattern can also be buried in a target layer. Please see FIG. 9, which show a further configuration of pattern transfer according to one embodiment of the disclosure. In FIG. 9, a first pattern 421 and 422 is formed within (ex: buried in) a target layer 40 (such as a substrate), and the mandrels with the sidewall spacers are formed on above the first pattern 421 and 422. The first pattern 32 buried in the target layer 40 also corresponds to the position(s) of the closed end(s) of the to-be-transferred pattern (ex: second pattern), which is able to stop pattern transfer of the closed end of the second pattern during pattern transfer etching step.

Figure 10A:
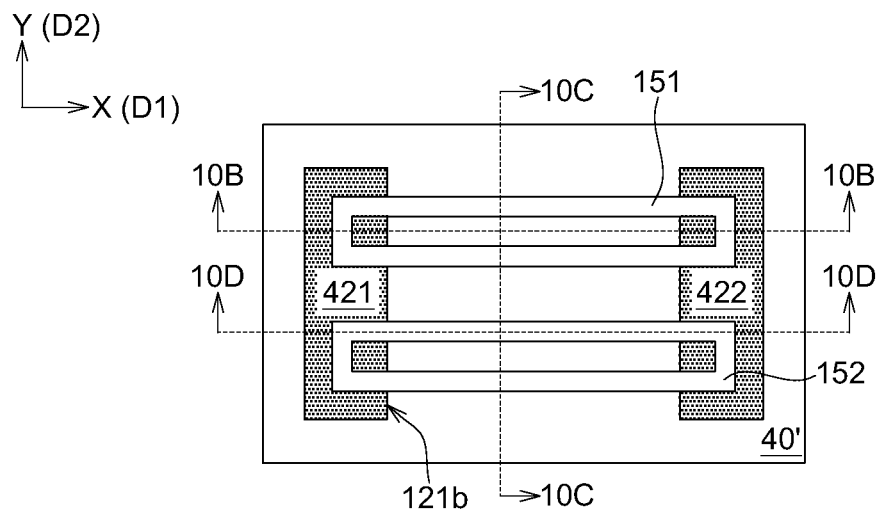
FIG. 10A to FIG. 13 illustrate a further applicable method of pattern transfer by forming a pre-cut pattern (ex: a first pattern 421 and 422) in a target layer according to a further embodiment of the disclosure.
Figure 10B:
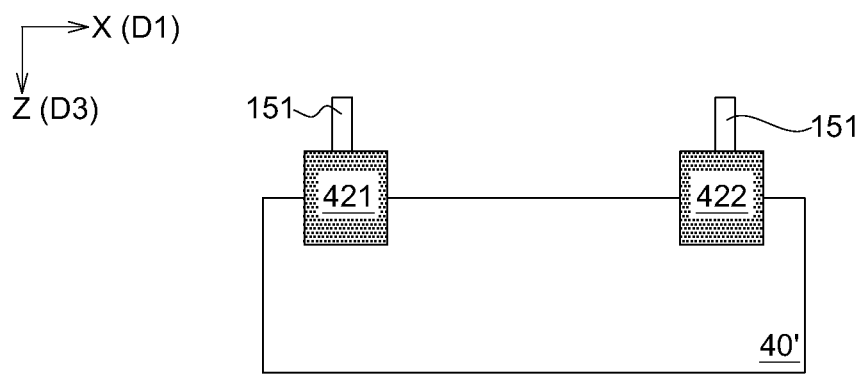
Figure 10C:
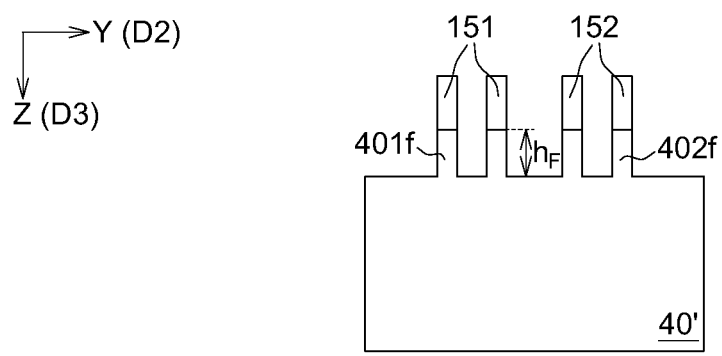
Figure 10D:
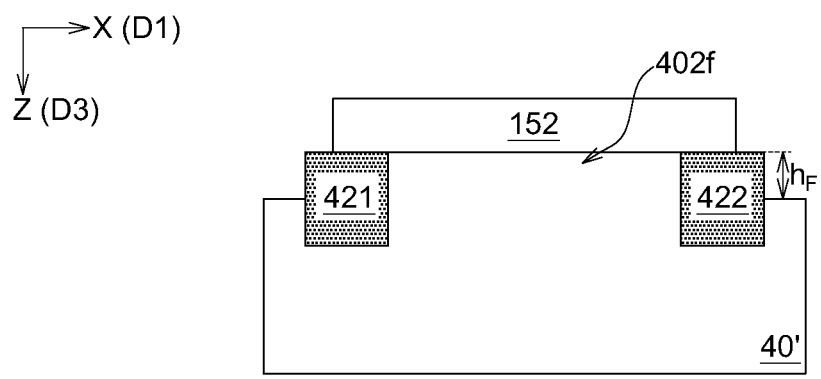

FIG. 10A to FIG. 13 illustrate a further applicable method of pattern transfer by forming a pre-cut pattern (ex: a first pattern 421 and 422) in a target layer according to a further embodiment of the disclosure. FIG. 10A is a top view of a second pattern (such as spacer loops 151 and 152) and a first pattern 421 and 422 after pattern transfer according to a further embodiment, wherein the second pattern is stilled remained on the patterned target layer 40' and has not been removed. FIG. 10B is a cross-sectional view of FIG. 10A along a cross-sectional line 10B-10B (in X-direction), FIG. 10C is a cross-sectional view of FIG. 10A along a cross-sectional line 10C-10C (in Y-direction), and FIG. 10D is a cross-sectional view of FIG. 10A along a cross-sectional line 10D-10D (in X-direction). As shown in FIG. 10A-FIG. 10D, the first pattern 421 and 422 stops transferring pattern of the closed ends of the second pattern to the target layer 40, so as to form a patterned target layer 40'; thus, the patterned target layer 40' comprises the first pattern 421, 422 and the protruding portions 401$f$ and 402$f$ (respectively beneath the second pattern such as spacer loops 151 and 152) with a first height $h_F$. Also, the first pattern 421, 422 is remained in the target layer during pattern transfer.

Figure 11A:
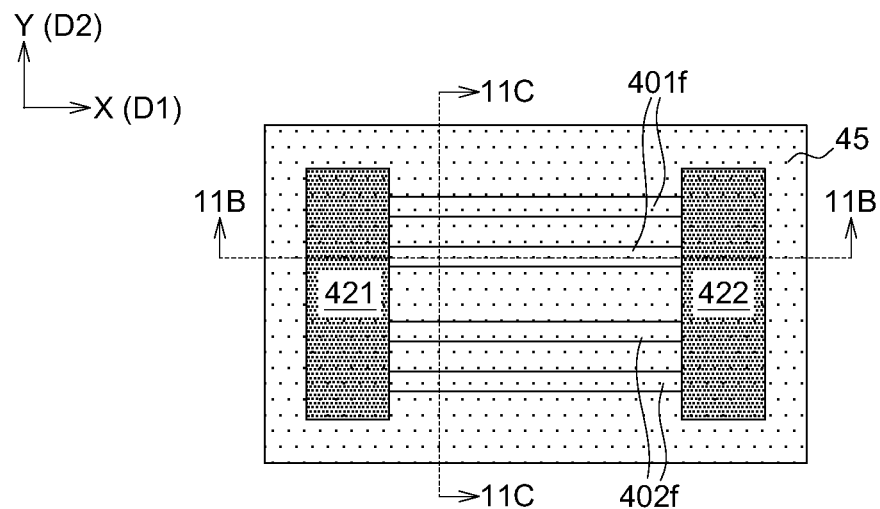
Figure 11B:
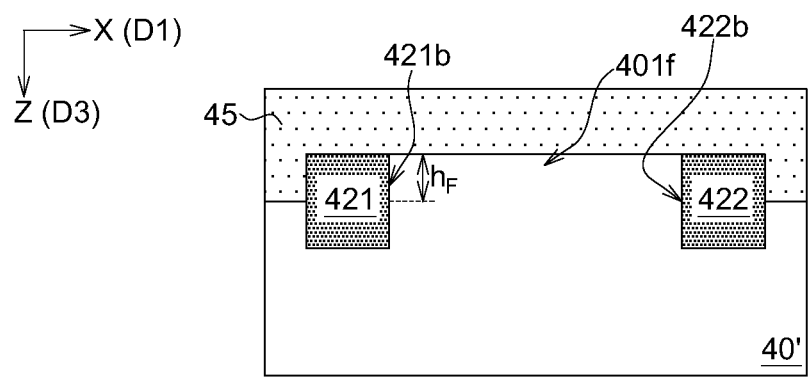
Figure 11C:
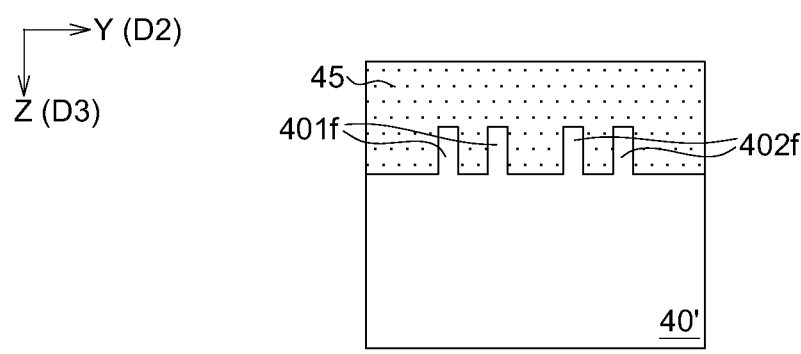

FIG. 11A is a top view of the patterns after removing the second pattern (such as spacer loops 151 and 152) followed by depositing a dielectric layer according to a further embodiment, FIG. 11B is a cross-sectional view of FIG. 11A along a cross-sectional line 11B-11B (in X-direction), and FIG. 11C is a cross-sectional view of FIG. 11A along a cross-sectional line 11C-11C (in Y-direction). As shown in FIG. 11A-FIG. 11C, the second pattern (such as spacer loops 151 and 152) are removed, and a dielectric layer 45 is further deposited on the patterned target layer 40', wherein the dielectric layer 45 and the first pattern 421, 422 comprise different materials. In one embodiment, the dielectric layer 45 is an oxide layer (ex: field oxide) for forming shallow trench isolation (STI) in the consequent process. Afterwards, the dielectric layer 45 is recessed to form a patterned dielectric layer 45' (ex: forming STI). From the top view of FIG. 11A, it is clearly indicated that no closed ends are formed at the underlying pattern; accordingly, the first pattern 421, 422 stops transferring pattern of the closed ends of the second pattern (such as spacer loops 151 and 152) to the patterned target layer 40' beneath. Also, FIG. 11A shows that the ends of a forming pattern such as the adjacent protruding portions 401$f$ and 402$f$ are spaced apart from each other, and FIG. 11B shows that the lateral surfaces of two opposite ends of the protruding portions 401$f$ (i.e. part of the forming pattern) contact the first pattern 421, 422 by extending along the sidewalls 421$b$, 422$b$ of the first pattern 421, 422 after pattern transfer.

Figure 12A:
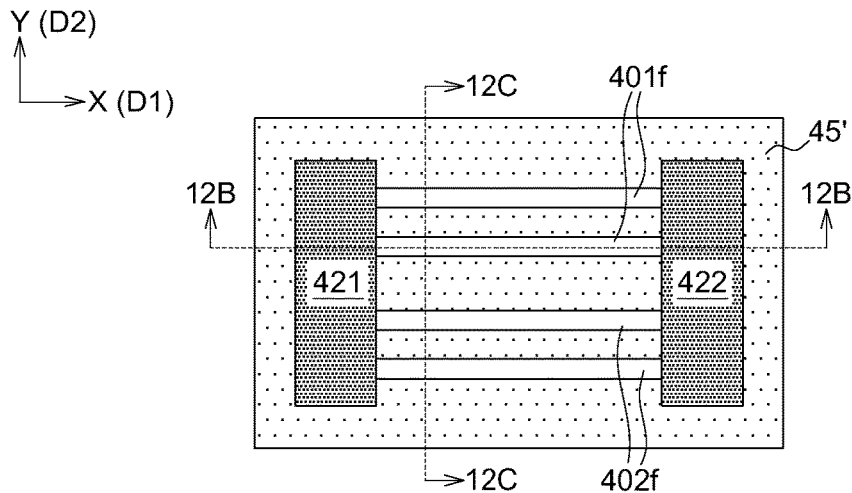
Figure 12B:
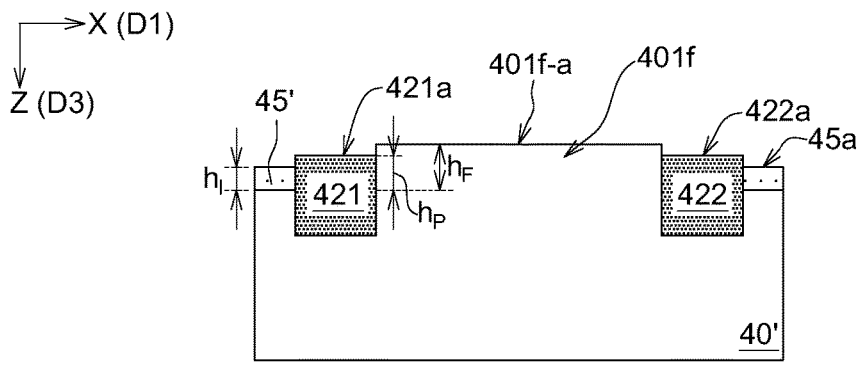
Figure 12B:
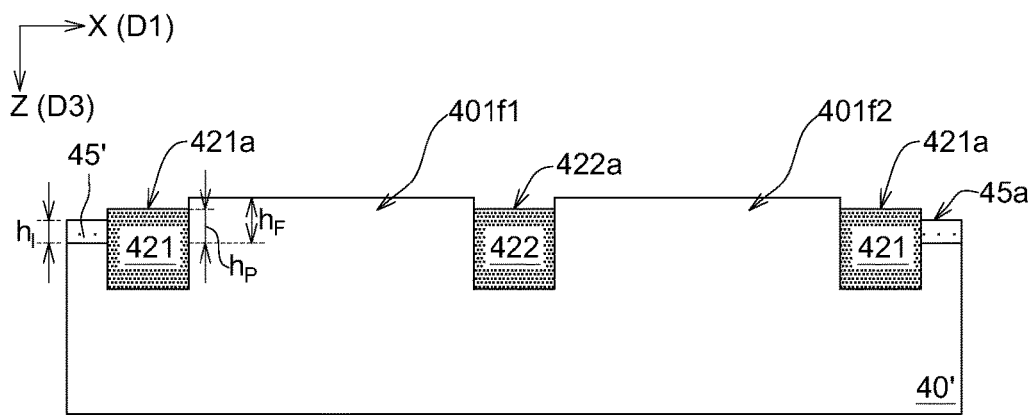
Figure 12C:
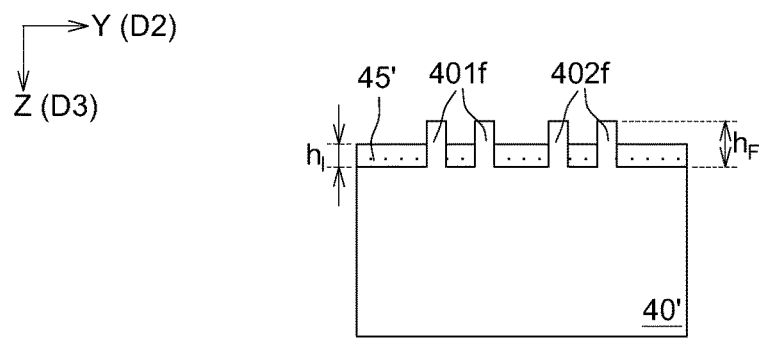

FIG. 12A is a top view of the patterns after recessing the dielectric layer 45 according to a further embodiment, FIG. 12B is a cross-sectional view of FIG. 12A along a cross-sectional line 12B-12B (in X-direction), and FIG. 12C is a cross-sectional view of FIG. 12A along a cross-sectional line 12C-12C (in Y-direction). As shown in FIG. 12A-FIG. 12C, the patterned dielectric layer 45' has a second height $h_I$ after recessing, wherein the second height $h_I$ is smaller than the first height $h_F$ of the protruding portions 401$f$ and 402$f$ of the patterned target layer 40'. Moreover, since the first pattern 421, 422 formed in the patterned target layer 40' would be remained in the patterned target layer 40' during recessing the dielectric layer 45, the first pattern 421, 422 would be protruded above the patterned dielectric layer 45' after recessing step, as shown in FIG. 12B, wherein a protruding height $h_P$ of the first pattern 421, 422 is smaller than the first height $h_F$ of the protruding portions 401$f$ and 402$f$ of the patterned target layer 40' (FIG. 12B and FIG. 12C). Accordingly, in one embodiment, the top surfaces 421$a$, 422$a$ of the first pattern 421, 422 (FIG. 12B) are higher (i.e. at a higher horizontal level) than the top surface 45$a$ of the patterned dielectric layer 45'. In one embodiment, the top surface of the protruding portions (such as the top surface 401$f$-$a$ of the protruding portion 401$f$) is higher than the top surfaces 421$a$, 422$a$ of the first pattern 421, 422, as shown in FIG. 12B.

Figure 13:
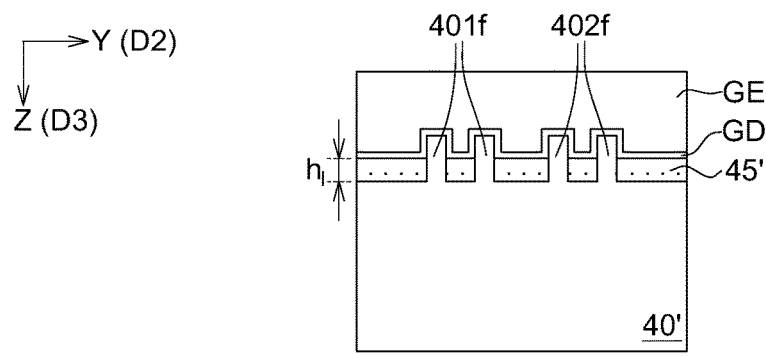

Furthermore, in one embodiment of the FinFETs, a gate dielectric GD is formed (ex: by deposition) to cover the top surfaces and sidewalls of protruding portions 401$f$/402$f$ (i.e. fins) and the top surfaces of the patterned dielectric layer 45' (i.e. STI regions), and a gate electrode GE is formed on the gate dielectric GD, as shown in FIG. 13. Alternatively, the gate dielectric GD can be formed by a thermal oxidation, and hence may include thermal silicon oxide; in this case, the gate dielectric GD is formed on the top surfaces and sidewalls of protruding portions 401$f$/402$f$, but not on the main parts of top surfaces of the patterned dielectric layer 45' (i.e. STI regions). Details of the FinFETs formation process and the remaining components of the FinFET including source and drain regions and source and drain silicides (not shown) are known in the art, and hence are not repeated herein.

Additionally, a first pattern can be provided correspondingly to a second pattern comprising elements (such as spacer loops) arranged in adjacent columns. FIG. 12B' is a cross-sectional view of another pattern after recessing the dielectric layer 45 according to another embodiment. Please also refer to FIG. 12A, FIG. 12B and FIG. 12C for the details of related elements. In another example, after recessing a dielectric layer to form a patterned dielectric layer 45' (ex: forming STI), the protruding height $h_P$ of the first pattern 421, 422 (positioned for stopping pattern transfer of the closed ends of the second pattern) is smaller than the first height $h_F$ of the protruding portions 401/1 and 401/2 of the patterned target layer 40' but higher than the second height $h_I$ of the patterned dielectric layer 45', wherein the protruding portions 401/1 and 401/2 of a forming pattern are positioned in adjacent columns, and the first pattern 422 is positioned correspondingly to the adjacent closed ends of the second pattern.

It is noted that whether the first pattern is formed above or within the target layer, the dielectric layer 45 and the first pattern (ex: 121/122, 421/422) comprising different materials are applicable in different applications; for example, as shown in the embodiment presented in FIG. 1A-FIG. 7, if the first pattern 121/122 remained in the product, a dielectric layer deposited later on the first pattern remained and on the patterned target layer 10' may comprise different material from the first pattern 121/122. Alternatively, in as shown in the embodiment presented in FIG. 9-FIG. 13, the first pattern 421/422 formed within the target layer 40 firstly would be remained in the patterned target layer 40' after pattern transfer, and a dielectric layer 45 deposited later may comprise different material from the first pattern 421/422. The present disclosure has no limitation to the application types of the first pattern configuration.

Figure 14A:
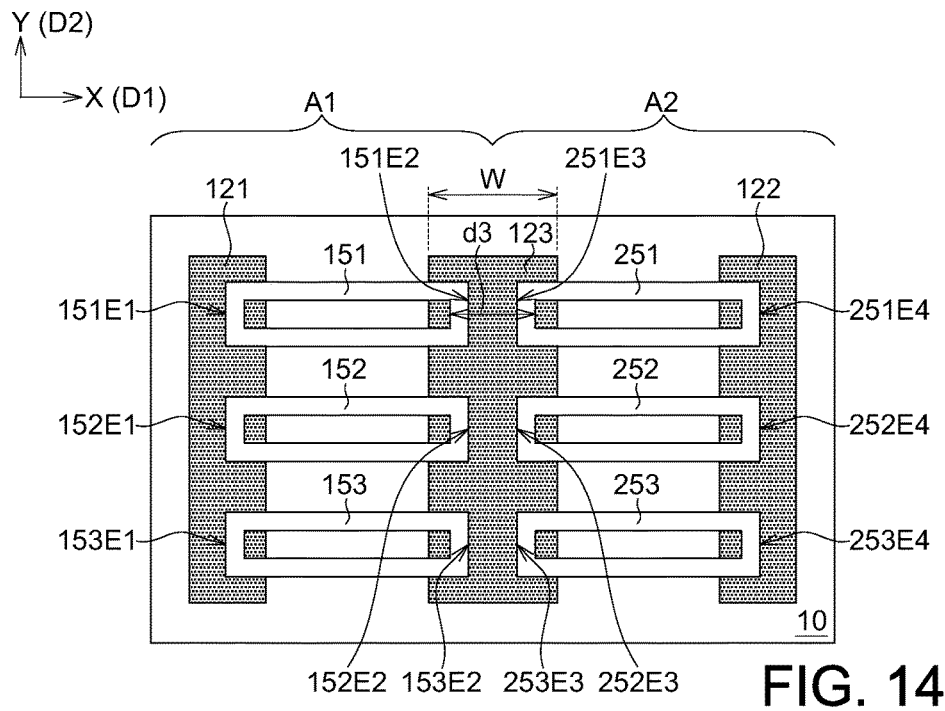
FIG. 14A and FIG. 14B show top-view configurations of modified first and second patterns before and after pattern transfer according to yet another embodiment of the disclosure.
Figure 14B:
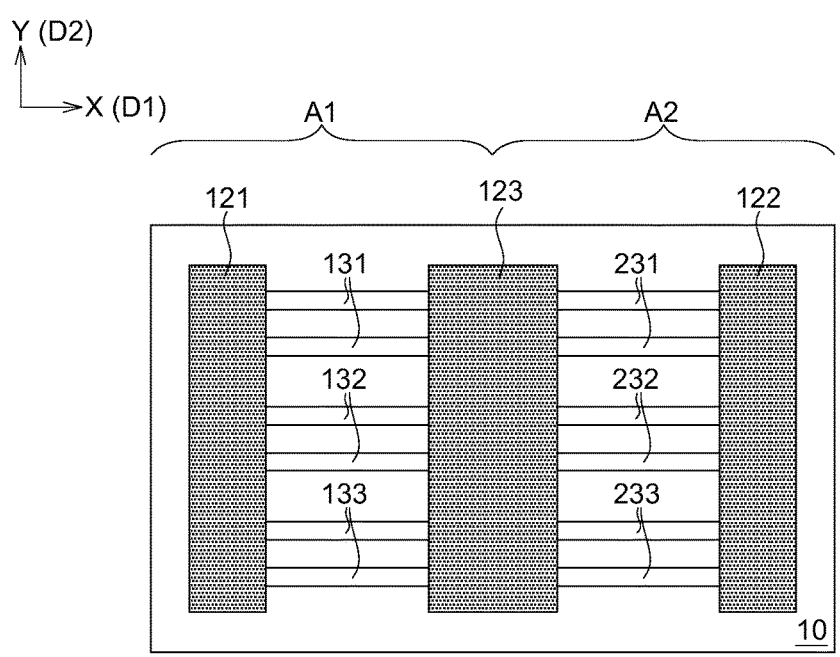

The embodiment above (ex: FIG. 1A-FIG. 7) illustrates two mandrels (i.e. for defining the spacer loops later for forming the second pattern) arranged in one column and disposed above a pre-cut pattern (ex: the first pattern formed above the target layer 10) as shown in FIG. 4A, which shows one closed end of a spacer loop (i.e. the first pattern) is shielded (or blocked) correspondingly by the first pattern underneath. However, the present disclosure is not limited thereto, and other arrangements and configurations with modified first and second patterns can be applied. FIG. 14A and FIG. 14B show top-view configurations of modified first and second patterns before and after pattern transfer according to yet another embodiment of the disclosure. Please also refer to the steps in FIG. 5A and FIG. 6A for the similar fabrication, and the formation details are not redundantly repeated.

In FIG. 14A and FIG. 14B, six spacer loops 151-153 and 251-253 are arranged as two columns and three rows for exemplification (not for limitation). In one embodiment, a first pattern comprises a first feature 123, a second feature 121 and a third feature 122, as shown in FIG. 14A and FIG. 14B. Each of the spacer loops extends along the first direction D1 (ex: X-direction), and the spacer loops positioned adjacently (ex: 151 vs. 152) in the same column are arranged along a second direction D2 (ex: Y-direction), wherein a first pattern (ex: 121/122/123) extends along the second direction D2 to stop transferring the pattern of closed ends of the spacer loops to the target layer 10.

In one example, the second pattern comprises at least two spacer loops positioned adjacently (such as the spacer loops 151 and 251), and adjacent closed ends of the two spacer loops are blocked (/shielded) by the first pattern (such as the first feature 123) during pattern transfer. Accordingly a width W of the first pattern (such as the first feature 123) corresponding to the adjacent closed ends of the two spacer loops (such as the spacer loops 151 and 251) is larger than a distance d3 between the mandrel (not shown in FIG. 14A) filled in the two adjacent spacer loops before.

As shown in FIG. 14A, a second pattern of an embodiment may comprise a first group of spacer loops (such as the spacer loops 151-153 (left column), disposed in a first region A1) and a second group of spacer loops (such as the spacer loops 251-253 (right column), disposed in a second region A2) positioned adjacently, and the first group of spacer loops (such as 151-153) are aligned with the second group of spacer loops (such as 251-253) at a first direction D1 (ex: X-direction) as shown in FIG. 14A. The first spacer loops (ex: 151-153) have the first closed ends such as 151E1, 152E1, 153E1 and the second closed ends such as 151E2, 152E2, 153E2 at two opposite sides of the first spacer loops (ex: 151-153). The second spacer loops (ex: 251-253) have the third closed ends such as 251 E3, 252E3, 253E3 closer to the second closed ends such as 151E2, 152E2, 153E2, and the fourth closed ends such as 251E4, 252E4, 253E4 at two opposite sides of the second spacer loops (ex: 251-253). Also, the closed ends (such as the second closed ends 151E2, 152E2, 153E2) of the first group of spacer loops 151-153 and the closed ends (such as the third closed ends 251 E3, 252E3, 253E3) of the second group of spacer loops 251-253 are positioned adjacently and blocked (shielded) together by the first feature 123 of the first pattern underneath (FIG. 14A) to achieve "cutting effect" during pattern transfer.

Similarly, during transferring the second pattern to the target layer 10, the second feature 121 of the first pattern stops transferring pattern of the first closed ends (such as 151E1, 152E1, 153E1) of the first spacer loops 151-153 to the target layer 10; and the third feature 122 of the first pattern stops transferring pattern of the fourth closed ends (such as 251E4, 252E4, 253E4)) of the second spacer loops 251-253 to the target layer 10.

As shown in FIG. 14B, after the pattern of spacer loops 151-153 and 251-253 is transferred to the underlying material layer followed by removing the spacer loops 151-153 and 251-253, the patterned portions of the material layer such as portions of 131-133 and 231-233 are formed, respectively. Accordingly, in one embodiment, the patterned material layer comprises line patterns (ex: 151-153 and 251-253) after pattern transfer, wherein the closed ends of the second pattern (ex: spacer loops 151-153 and 251-253) are blocked (/shielded) by the first pattern (ex: 121/122/123) during pattern transfer.

Figure 15:
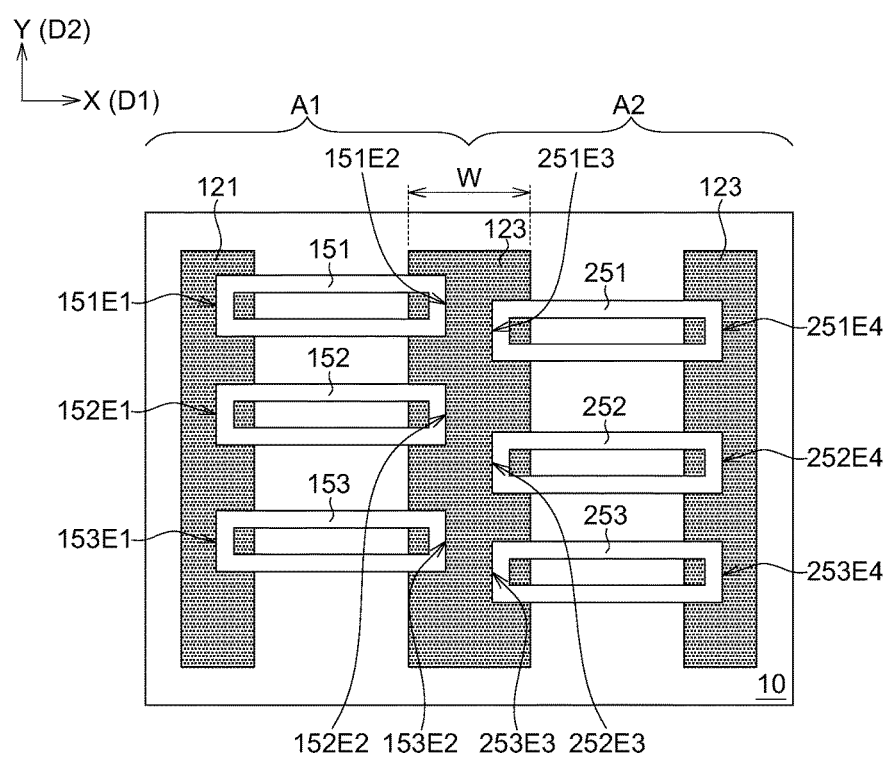
FIG. 15 shows a top-view configuration of modified first and second patterns before and after pattern transfer according to still another embodiment of the disclosure.

FIG. 14A-FIG. 14B illustrates the spacer loops such as 151-153 and 251-253 are aligned to each other. However, the disclosure is not limited to this application. The spacer loops as a second pattern of the embodiment in different positions such as in different rows or columns can be aligned or misaligned to each other; also the pitches between the spacer loops in the applications can be the same or different. FIG. 15 shows a top-view configuration of modified first and second patterns before and after pattern transfer according to still another embodiment of the disclosure. The identical and/or similar elements of FIG. 15 and FIG. 14A are designated with the same and/or similar reference numerals, and the details are not redundantly repeated. In FIG. 15, the second pattern comprises a first group of spacer loops 151-153 and a second group of spacer loops 251-253 positioned adjacently, and the first group of spacer loops 151-153 are misaligned with the second group of spacer loops 251-253 at the first direction D1 (ex: x-direction), wherein adjacent closed ends of the first group of spacer loops and the second group of spacer loops (ex: 151E2-153E2 vs. 251E3-253E3) are blocked (/shielded) together by the first feature 123 during pattern transfer; also, the closed ends (ex: 151E1-153E1) of the first group of spacer loops 151-153 and the closed ends (ex: 251E4, 252E4, 253E4) of the second spacer loops 251-253 are respectively blocked by the second feature 121 and the third feature 122. Even the second pattern (ex: the spacer loops) above the target layer are non-orderly distributed, the first pattern of the embodiment can be designed with the portions for blocking adjacent closed ends of different spacer loops, so as to stop pattern transfer of the closed end of the second pattern during pattern transfer etching step.

According to the aforementioned descriptions, a method of pattern transfer is provided. In the embodied method, a pre-cut pattern (such as a first pattern formed above a target layer) is formed for determining cutting positions before forming another pattern such as mandrels and sidewall spacers (i.e. referred as a second pattern in the embodiment), and the pre-cut pattern of the embodiment stops transferring pattern of the closed end of another pattern (ex: second pattern) to the target layer. Therefore, after transferring the second pattern (such as sidewall spacers remained configured as spacer loops) to the target layer, a patterned target layer has a line pattern without closed ends.

The embodiment of the present disclosure can be applied to manufacture a semiconductor device with linear patterns such as conductive traces/lines. According to the design of the embodied method, because of the existence of a pre-cut pattern, it is no needs cut the closed ends of patterns after pattern transfer to satisfy the electrical properties required in the application, and a complete pattern (ex: conductive traces/lines with opened ends) can be constructed instantly after pattern transfer. Additionally, the embodied design is compatible with the current fabrication process, which is suitable for mass production.

Additionally, it is noted that the second pattern (ex: plural spacer loops) as described above can be arranged optionally, such as arranged in a matrix pattern (i.e. having m columns and n rows, m and n are integers) or other pattern, and the disclosure has no particular limitation to the second pattern. The applicable arrangements of the second pattern (ex: the spacer loops) are not limited to the embodiments (ex: FIG. 4A, FIG. 10A and FIG. 11) mentioned above, and can be varied depending on the practical application; for example, the spacer loops as a second pattern of the embodiment can be aligned or misaligned to each other or non-orderly distributed, and the pitches and/or widths between the loops in the applications can be the same or different, . . . etc., depending on the target pattern required in the application. Thus, other embodiments with different configurations of known elements can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of pattern transfer, comprising:
providing a first pattern;
forming a second pattern above the first pattern, wherein one closed end of the second pattern partially overlaps with the first pattern; and
transferring the second pattern to a target layer under the second pattern, wherein the first pattern stops transferring a pattern of the closed end of the second pattern to the target layer, and the second pattern comprises spacer loops, and each of the spacer loops extends along a first direction, and the spacer loops are positioned adjacently and arranged along a second direction, wherein the first pattern extends along the second direction to stop transferring patterns of closed ends of the spacer loops to the target layer.

2. The method according to claim 1, wherein the first pattern has a first edge and a second edge positioned oppositely, and the closed end of the second pattern extends over the second edge but spaces apart from the first edge.

3. The method according to claim 1, further comprising forming a material layer on the target layer, wherein the second pattern is formed on the material layer.

4. The method according to claim 3, further comprising: providing the target layer, and the first pattern being formed above the target layer and embedded within the material layer, wherein the second pattern is formed above the first pattern and the target layer.

5. The method according to claim 3, wherein forming the second pattern comprises:
forming mandrels on the material layer; and ends of the mandrels overlapping above the first pattern;
forming sidewall spacers surrounding sidewalls of the mandrels; and
removing the mandrels, wherein the sidewall spacers remained form the second pattern.

6. The method according to claim 5, further comprising transferring the second pattern to the material layer to form a patterned material layer, wherein the closed end of the second pattern is blocked by the first pattern during the pattern transfer.

7. The method according to claim 5, wherein the first pattern has a first edge and a second edge positioned oppositely, and one of the ends of the mandrels extends over the second edge but spaces apart from the first edge by a first distance (d1).

8. The method according to claim 7, wherein the closed end of the second pattern formed by the sidewall spacers remained extends over the second edge but spaces apart from the first edge by a second distance (d2), wherein the second distance (d2) is smaller than the first distance (d1).

9. The method according to claim 1, further comprising: providing the target layer, and the first pattern being formed within the target layer, wherein the second pattern is formed above the target layer and above the first pattern.

10. The method according to claim 1, wherein a patterned target layer is generated after transferring the second pattern to the target layer, and the method further comprises: depositing a dielectric layer on the patterned target layer, and the dielectric layer and the first pattern comprise different materials.

11. The method according to claim 10, further comprising recessing the dielectric layer to form a patterned dielectric layer, wherein a top surface of the patterned dielectric layer is lower than a top surface of the first pattern.

12. The method according to claim 1, wherein adjacent closed ends of two of the spacer loops are blocked by the first pattern during the pattern transfer.

13. The method according to claim 12, wherein a width (W) of the first pattern corresponding to the adjacent closed ends of two of the spacer loops is larger than a distance between mandrels of two of the spacer loops.

14. The method according to claim 1, wherein the second pattern comprises a first group of the spacer loops and a second group of the spacer loops positioned adjacently, and the first group of the spacer loops are aligned with the second group of the spacer loops at the first direction, wherein adjacent closed ends of the first group of the spacer loops and the second group of the spacer loops are blocked or shielded together by the first pattern during the pattern transfer.

15. The method according to claim 1, wherein the second pattern comprises a first group of the spacer loops and a second group of the spacer loops positioned adjacently, and the first group of the spacer loops are misaligned with the second group of the spacer loops at the first direction wherein adjacent closed ends of the first group of the spacer loops and the second group of the spacer loops are blocked or shielded together by the first pattern during the pattern transfer.

16. A method for pattern transfer, comprising:
providing a first pattern;
forming a second pattern above the first pattern, and the second pattern comprising:
first spacer loops corresponding to a first region of a target layer under the second pattern; and
second spacer loops corresponding to a second region of the target layer, wherein adjacent closed ends of the first spacer loops and the second spacer loops are formed above and corresponding within a first feature of the first pattern; and
transferring the second pattern to the target layer, wherein the first feature of the first pattern stops transferring patterns of the adjacent closed ends of the first spacer loops and the second spacer loops to the target layer.

17. The method according to claim 16, wherein the first spacer loops have first closed ends and second closed ends at two opposite sides of the first spacer loops; and
the second spacer loops have third closed ends closer to the second closed ends and fourth closed ends at two opposite sides of the second spacer loops,
wherein the second closed ends of the first spacer loops and the third closed ends of the second spacer loops are positioned adjacently and shielded by the first feature of the first pattern underneath.

18. The method according to claim 17, wherein the first pattern further comprises a second feature, during transferring the second pattern to the target layer, the second feature of the first pattern stops transferring patterns of the first closed ends of the first spacer loops to the target layer; and
the first pattern further comprises a third feature, during transferring the second pattern to the target layer, the third feature of the first pattern stops transferring patterns of the fourth closed ends of the second spacer loops to the target layer.

19. The method according to claim 16, wherein a patterned target layer is generated after transferring the second pattern to the target layer, and the method further comprises:
depositing a dielectric layer on the patterned target layer, and the dielectric layer and the first pattern comprise different materials; and
recessing the dielectric layer to form a patterned dielectric layer, wherein a top surface of the patterned dielectric layer is lower than a top surface of the first pattern.

* * * * *